(12) United States Patent
Lee et al.

(10) Patent No.: US 7,203,066 B2
(45) Date of Patent: Apr. 10, 2007

(54) HEAT SINK ASSEMBLY INCORPORATING SPRING CLIP

(75) Inventors: Hsieh Kun Lee, Tu-Chen (TW); Dongyun Lee, Shenzhen (CN); Zhijie Zhang, Shenzhen (CN); Hong Bo Shi, Shenzhen (CN)

(73) Assignees: Fu Zhun Precision Ind. (Shenzhen) Co., Ltd., Shenzhen (CN); Foxcon Technology Co., Ltd., Tu-Cheng (TW)

( * ) Notice: Subject to any disclaimer, the term of this patent is extended or adjusted under 35 U.S.C. 154(b) by 336 days.

(21) Appl. No.: 10/901,513

(22) Filed: Jul. 28, 2004

(65) Prior Publication Data
US 2005/0094377 A1 May 5, 2005

(30) Foreign Application Priority Data
Oct. 31, 2003 (TW) .............................. 92219411 U

(51) Int. Cl.
*G06F 1/20* (2006.01)
(52) U.S. Cl. ............... 361/704; 165/80.3; 174/16.3
(58) Field of Classification Search ............... 361/704, 361/709; 165/185, 80.3; 257/718, 719; 174/16.3; 24/546, 296; 248/505, 510
See application file for complete search history.

(56) References Cited

U.S. PATENT DOCUMENTS

| | | | | |
|---|---|---|---|---|
| 5,386,338 A * | 1/1995 | Jordan et al. | ............ | 361/704 |
| 5,464,054 A | 11/1995 | Hinshaw et al. | | |
| 5,771,153 A * | 6/1998 | Sheng | ............ | 165/80.3 |
| 5,870,288 A * | 2/1999 | Chen | ............ | 361/704 |
| 5,991,152 A * | 11/1999 | Chiou | ............ | 361/704 |
| 6,049,457 A * | 4/2000 | Lee | ............ | 361/704 |
| 6,175,499 B1 | 1/2001 | Adams et al. | | |
| 6,392,886 B1 * | 5/2002 | Lee et al. | ............ | 165/185 |
| 6,431,259 B2 | 8/2002 | Hellbruck et al. | | |
| 6,510,054 B1 * | 1/2003 | Chen | ............ | 361/704 |
| 6,644,387 B1 | 11/2003 | Lee et al. | | |
| 6,704,976 B1 * | 3/2004 | Chen | ............ | 174/16.3 |
| 7,055,589 B2 * | 6/2006 | Lee et al. | ............ | 165/185 |
| 2003/0106670 A1 * | 6/2003 | Lee et al. | ............ | 165/80.3 |

FOREIGN PATENT DOCUMENTS

| | | |
|---|---|---|
| CN | 2509641 Y | 9/2002 |
| TW | 412024 | 11/2000 |

* cited by examiner

*Primary Examiner*—Lisa Lea-Edmonds
(74) *Attorney, Agent, or Firm*—Wei Te Chung

(57) ABSTRACT

A heat sink assembly includes a heat sink (20) and a pair of clips (10) attached on opposite sides of the heat sink for securing the heat sink to an electronic component (40). The heat sink includes a base (22) and a plurality of fins (24). A pair of protrusions (28) is formed on bottom portions of adjacent two fins. A locking slot (29) is therefore formed between the base, the two adjacent fins, and the protrusions. The clip includes a pressing portion (12) squeezedly received in the locking slot, a pair of extension portions (14) extending from opposite ends of the pressing portion, and a pair of hooks (16) formed on free ends of the extension portions. When the clips are deformed to cause the hooks to engage with the electronic component, the pressing portions of the clips press the heat sink toward the electronic component.

20 Claims, 4 Drawing Sheets

HEAT SINK ASSEMBLY INCORPORATING SPRING CLIP

BACKGROUND OF THE INVENTION

1. Field of the Invention

The present invention relates to a heat sink assembly, and particularly to heat sink assembly incorporating a spring clip which can readily and firmly mount a heat sink to an electronic device.

2. Prior Art

As computer technology continues to advance, electronic components of computers are being made to provide faster operational speeds and greater functional capabilities. When an electronic component operates at high speed in a computer enclosure, its temperature can increase greatly. It is desirable to dissipate the generated heat quickly, for example by using a heat sink attached to the electronic component in the enclosure. This allows the electronic component in the enclosure to function within their normal operating temperature ranges, thereby assuring the quality of data management, storage and transfer. Oftentimes, a clip is required for mounting the heat sink to the electronic component.

A wide variety of clips, such as: linear type of wire clips, plate-type of clips, pin-type of clips, are available in the prior art. FIG. 4 shows a conventional linear clip 1 mounting a heat sink 5 to an electronic package 7. The clip 1 comprises an elongated central pressing portion 2 defining a major axis and a pair of end portions 3, 4 extending in substantially opposite directions normal to the axis of the pressing portion 2 to define a substantially Z-shaped device. In assembly, the pressing portion 2 of the clip 1 is positioned in a groove 6 of the heat sink 5. The end portions 3, 4 are pressed downward to engage with tabs 8 formed on opposite sides of the package 7. The clip 1 is deformed and the pressing portion 2 presses the heat sink 5 toward the package 7. The heat sink 5 is therefore secured to the package 7 and connected with an electronic component installed on the package 7.

However, the pressing portion 2 is linear shape and is readily to slide in the groove 6 of the heat sink 5, which results in the heat sink 5 not being capable of intimate contact the electronic component on the package 7.

SUMMARY OF THE INVENTION

Accordingly, an object of the present invention is to provide a clip which can firmly and readily secure a heat sink to an electronic device.

To achieve the above-mentioned object, a heat sink assembly in accordance with a preferred embodiment of the present invention comprises a heat sink and a pair of clips attached on opposite sides of the heat sink for securing the heat sink to an electronic device. The heat sink includes a base and a plurality of fins extending from the base. A pair of protrusions is formed on bottom portions of adjacent two fins. A locking slot is therefore formed between the base, the bottom portions of the two adjacent fins, and the protrusions. The clip includes a pressing portion squeenzedly received in the locking slot of the heat sink, a pair of extension portions extending from opposite ends of the pressing portion, and a pair of hooks formed on free ends of the extension portions for engaging with the electronic device. When the clips are deformed to cause the hooks to engage with the electronic device, the pressing portions of the clips press the heat sink toward the electronic device.

Other objects, advantages and novel features of the present invention will be drawn from the following detailed description of a preferred embodiment of the present invention with attached drawings, in which:

DETAILED DESCRIPTION OF THE INVENTION

Figure 1:
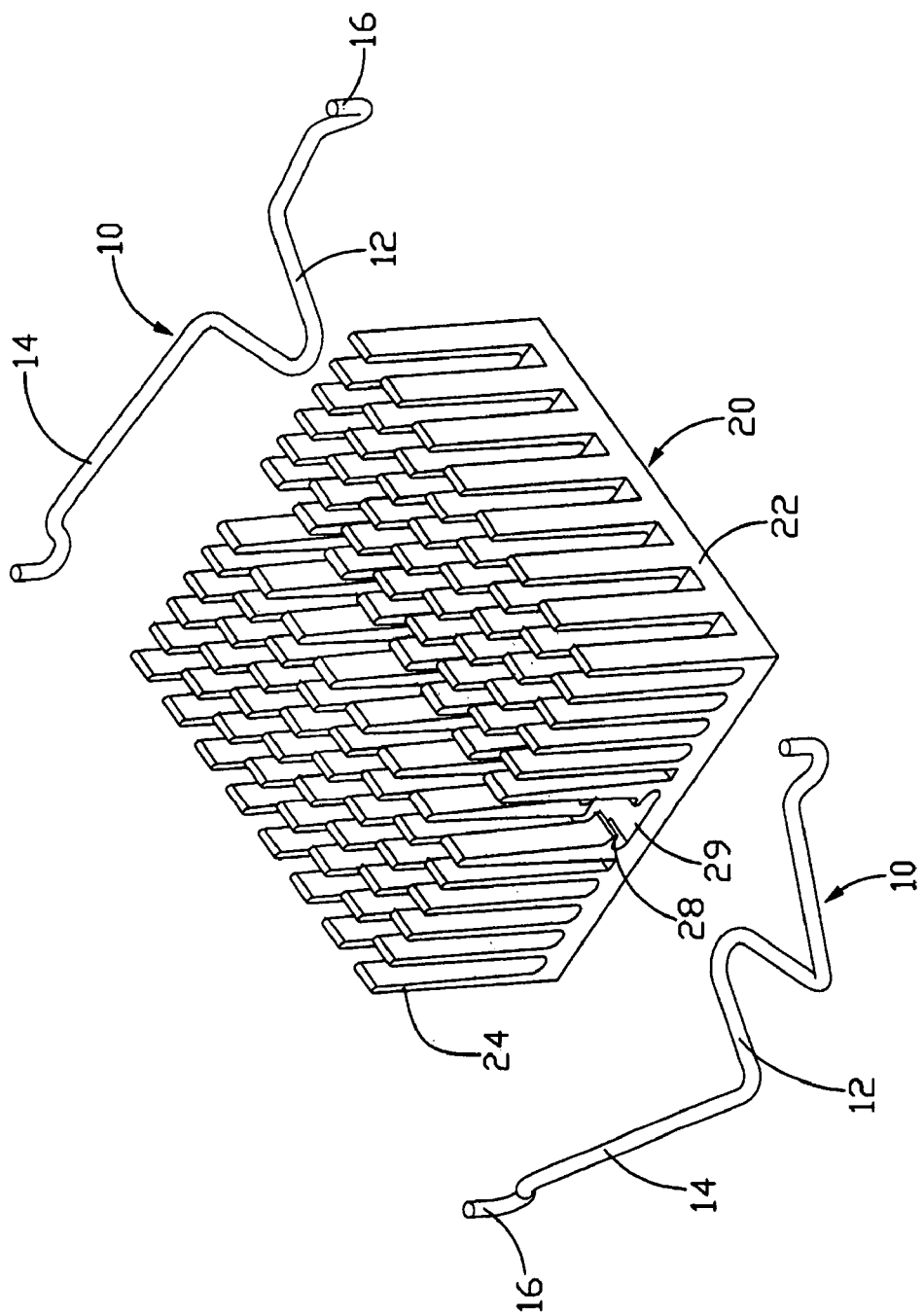
FIG. 1 is an exploded isometric view of a heat sink assembly in accordance with a preferred embodiment of the present invention.
Figure 3:
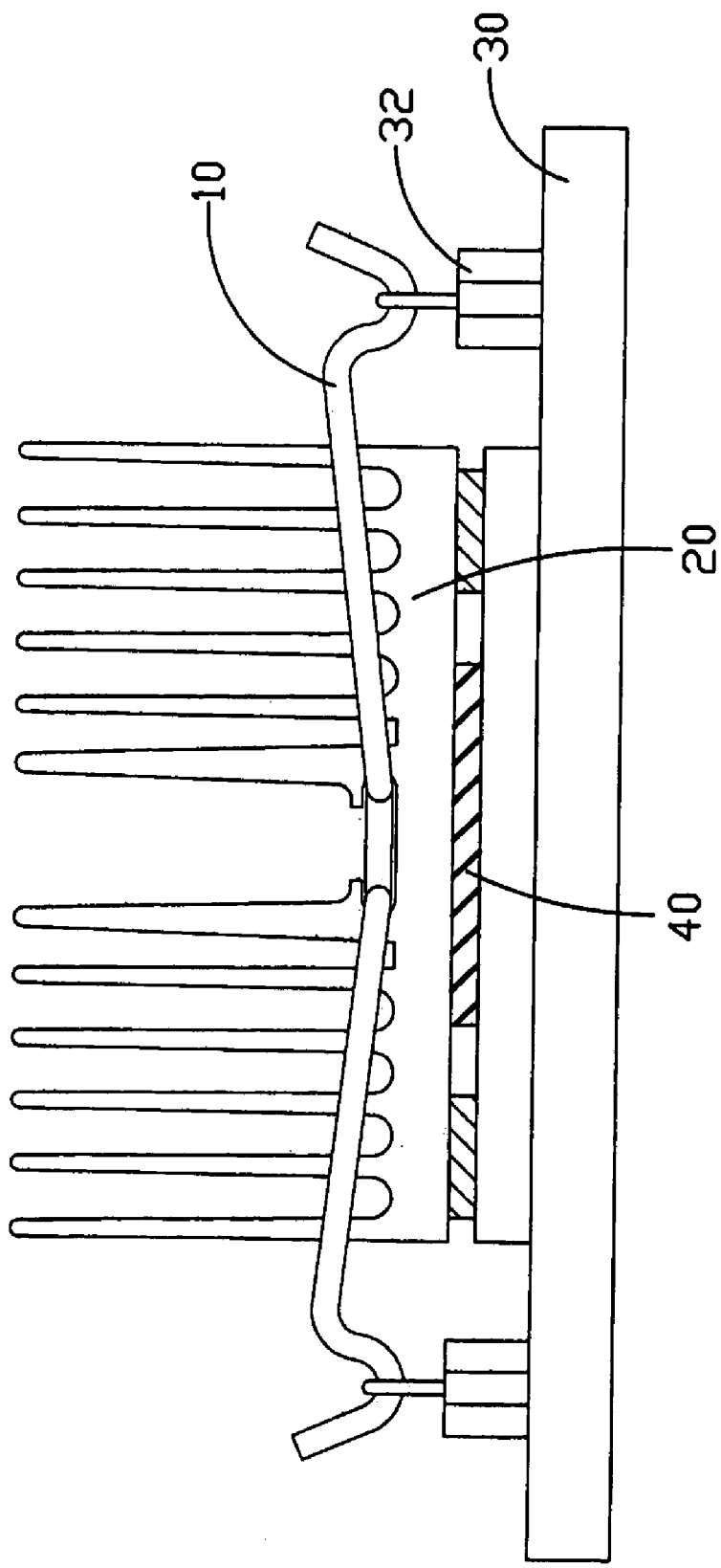
FIG. 3 is a side elevation view of the heat sink assembly of FIG. 1 mounted on a printed circuit board.
Figure 4:
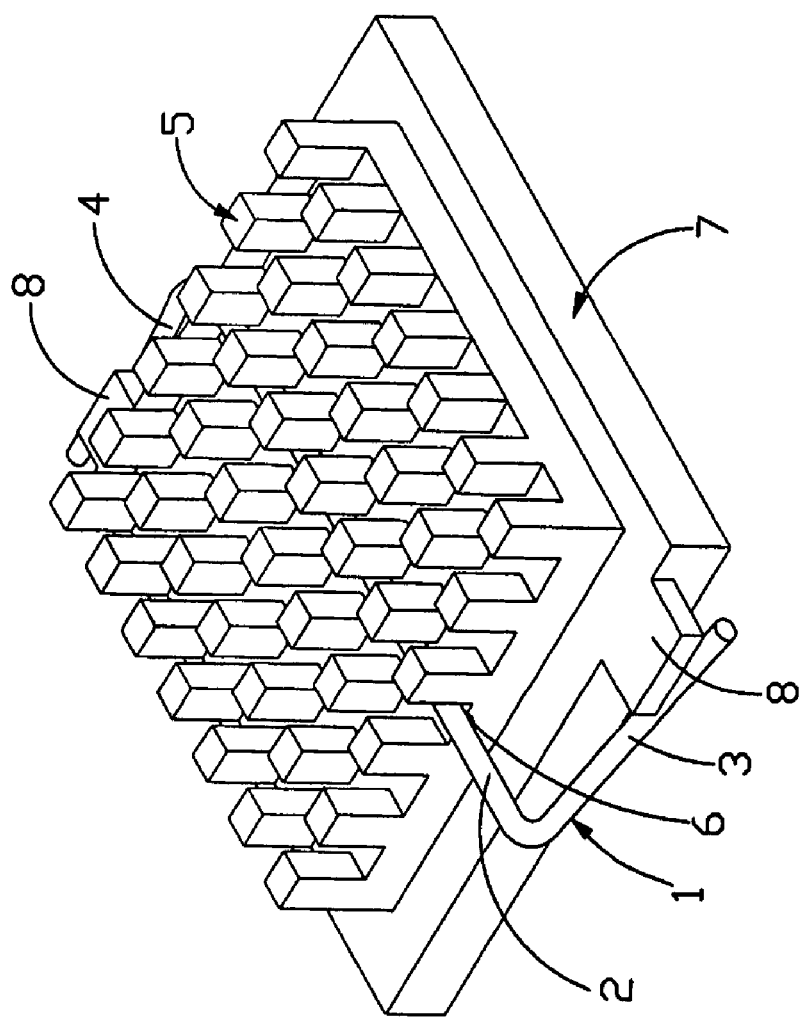
FIG. 4 shows a conventional clip mounting a heat sink to an electronic device.

FIG. 1 shows a heat sink assembly in accordance with a preferred embodiment of the present invention. The heat sink assembly comprises a heat sink 20 and a pair of clips 10 for securing the heat sink 20 to an electronic component 40 mounted on a printed circuit board 30 for heat dissipation therefrom (FIG. 3).

The heat sink 20 comprises a rectangular base 22 and a plurality of spaced fins 24 extending upwardly from the base 22. A central channel 26 (FIG. 2) is defined between two adjacent middle fins 24. A pair of protrusions 28 are formed from bottom portions of the two adjacent middle fins 24 to the channel 26. A locking slot 29 is therefore formed between the base 22, the bottom portions of the two adjacent fins 24, and the protrusions 28 in a bottom of the channel 26. A plurality of grooves (not labeled) is defined in the fins 24 perpendicular to the locking slot 29.

One clip 10 will be described in detail since both are identical in construction, function and operation. The clip 10 can be formed front any suitable material which is flexible such as a rod or heavy wire of steel, aluminum or the lick. The clip 10 comprises a pressing portion 12, a pair of extension portions 14 extending outwardly and upwardly from opposite ends of the pressing portion 12, and a pair of locking portions 16 formed on free ends of the extension portions 14 respectively. The pressing portion 12 is substantially V-shaped and comprises an arc acute angle. The locking portion 16 is a hook.

Figure 2:
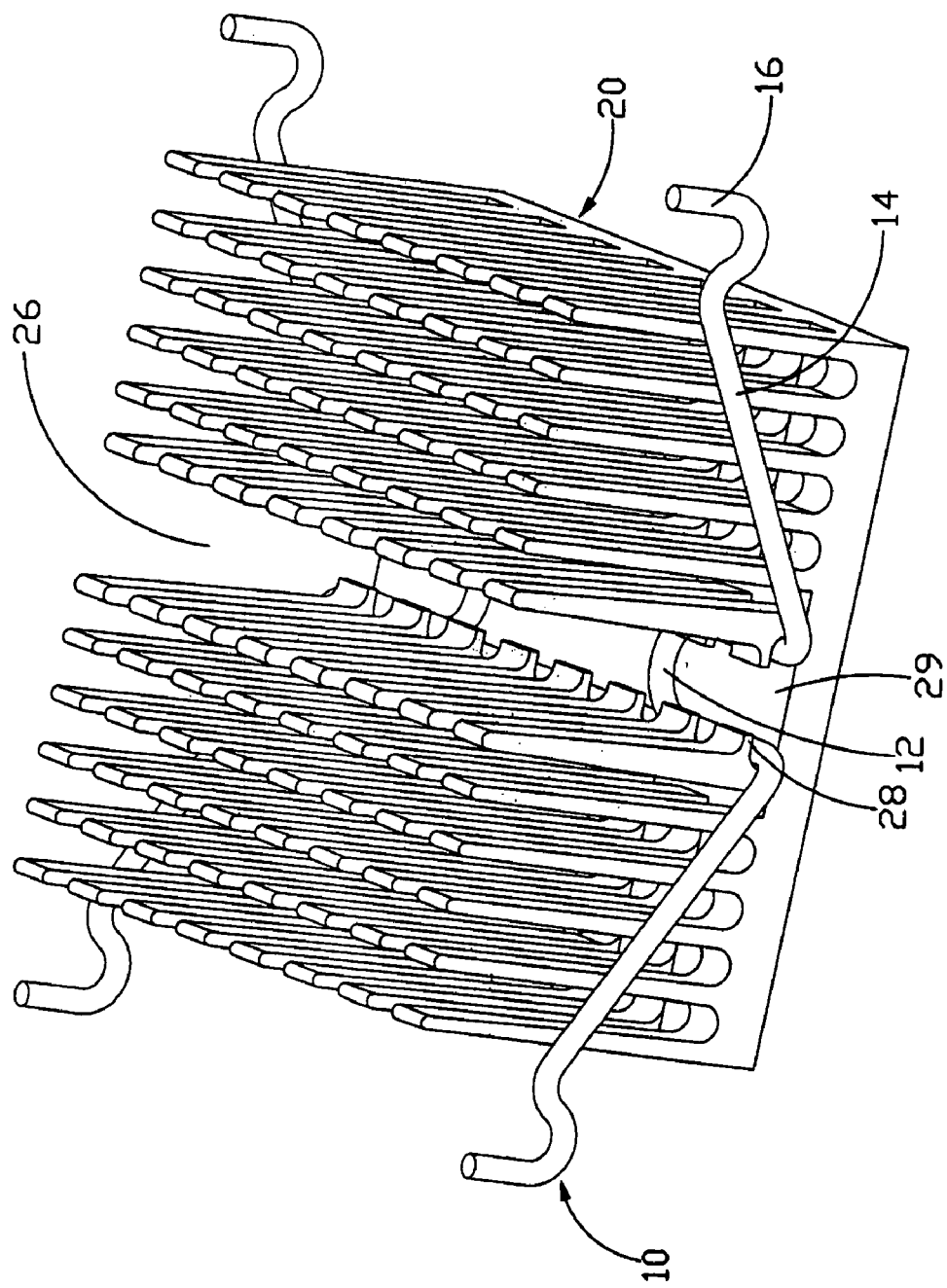
FIG. 2 is an assembled isometric view of the heat sink assembly of FIG. 1.

Referring also to FIG. 2, in assembly, the pressing portions 12 of the clips 10 are pushed into the locking slot 29 of the heat sink 20 from opposite sides of the heat sink 20. The pressing portions 12 are squeezed by the two adjacent middle fins 24 to be U-shaped. The pressing portions 12 are therefore deformed to secure the clips 10 to the heat sink 20.

Referring to FIG. 3, in use, the locking portions 16 of the clips 10 are downwardly pressed to engage with rings of the locking members 32 mounted on the printed circuit board 30. The clips 10 are deformed to cause the pressing portions 12 of the clips 10 to press the heat sink 20 toward the printed circuit board 30. The heat sink 20 is thus firmly secured to the printed circuit board 30 with the base 22 in intimate contact with the electronic component 40.

In the present invention, the pressing portions 12 of the clips 10 are squeezedly received in the locking slot 29 of the heat sink 20. The clips 10 cannot slide in the locking slot 29. The clips 10 can firmly secure the heat sink 20 to the electronic component 40.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat sink assembly for an electonic device comprising:
   a heat sink comprising a plurality of fins with a locking slot formed between two adjacent fins; and
   a clip comprising a pressing portion squeezedly received in the locking slot of the heat sink for positioning the clip to the heat sink, a pair of extension portions extending from opposite ends of the pressing portion, and a pair of locking portions formed on free ends of the extension portions for engaging with the electronic device.

2. The heat sink assexnbly as claimed in claim 1, wherein the pressing portion is substantially V-shaped before received in the locking slot and is substantially U-shaped when received in the locking slot.

3. The heat sink assembly as claimed in claim 2, wherein each locking portion comprises a hook.

4. The heat sink assembly as claimed in claim 1, wherein the heat sink further comprises a base from which the fins extend.

5. The heat sink assembly as claimed in claim 4, wherein a pair of protrusions is formed in bottom portions of said two adjacent fins, the locking slot being formed between the base, the bottom portions of said two adjacent fins and the protrusions.

6. The heat sink assembly as claimed in claim 5, wherein the protrusions face each other.

7. The heat sink assembly as claimed in claim 5, wherein the protrusions directly press the pressing portion of the clip towards the base of the heat sink.

8. The heat sink assembly as claimed in claim 1, wherein a plurality of grooves is defined in the fins perpendicular to the locking slot.

9. The heat sink assembly as claimed in claim 1, wherein the pressing portion is squeezed by two adjacent fins along a first direction for positioning the clip to the heat sink before the locking portions are pressed along a second direction different form the first direction for engaging with the electronic device.

10. The heat sink assembly as claimed in claim 1, wherein the extension portions of the clip are positioned at a same side of the heat sink after the clip is assembled to the heat sink.

11. The heat sink assembly as claimed in claim 1, wherein the pressing portion is capable of being deformed to cause the clip being positioned to the heat sink; the extension portions of the clip are capable of being deformed to cause the heat sink engaging with the electronic device wherein the deformation of the pressing portion is independent from the deformations of the extension portions of the clip.

12. The heat sink assembly as claimed in claim 11, wherein the pressing portion comprises an included angle.

13. A heat dissipating device assembly comprising:
    an electronic device providing a plurality of locking members;
    a heat sink mounted on the electronic device surrounded by the locking members, the heat sink defining a locking slot; and
    a pair of clips each comprising a pressing portion squeezedly received in opposite sides of the locking slot, a pair of locking portions formed on opposite ends thereof,
    wherein when the clips are deformed to cause the locking portions to engage with corresponding locking members of the electronic device, the pressing portions of the clips press the heat sink toward the electronic device;
    wherein each of the locking members of the electronic device comprises a ring, and the locking portion of the heat sink comprises a hook engaging with the ring.

14. The heat dissipating device assembly as claimed in claim 13, wherein the pressing portion is substantially V-shaped before received in the locking slot and is substantially U-shaped when received in the locking slot.

15. The heat dissipating device assembly as claimed in claim 14, wherein each clip further comprises a pair of extension portions extending from opposite ends of the pressing portion, the locking portions being formed on free ends of the extension portions respectively.

16. The heat dissipating device assembly as claimed in claim 13, wherein the heat sink comprises a base and a plurality of spaced fins extending from the base.

17. The heat dissipating device assembly as claimed in claim 16, wherein a pair of protrusions is formed on bottom portions of adjacent two fins, and wherein the locking slot is formed between the base, the bottom portions of said two adjacent fins, and the protrusions.

18. The heat dissipating device assembly as claimed in claim 17, wherein a plurality of grooves is defined in the fins perpendicular to the locking slot.

19. A heat dissipation device assembly comprising:
    a heat generating device mounted on a board;
    a heat sink seated upon the heat generating device, said heat sink defining a base with a plurality of fins thereon;
    a groove defined in the heat sink along a first direction;
    a clip located by one edge of the base, said clip essentially roughly and basically extending in a second direction perpendicular to said first direction, said clip including a pair of extension portions by two sides of a pressing portion, an outer end of each of the extension portions locked around corresponding corners of the heat generating device, the pressing portion located around a middle portion of the base of the heat sink and extending along said first direction and received in the groove;
    wherein the pair of extension portions commonly perform a symmetrical and balanced tension relative to the pressing portion along said first direction so as to allow the pressing portion to stably press the heat sink against the heat generating device.

20. The heat dissipation device assembly as claimed in claim 19, wherein said pressing portion extends with a distance less than a dimension of said heat sink along said first direction.

* * * * *